United States Patent [19]

Collins et al.

[11] 3,769,694

[45] Nov. 6, 1973

[54] OHMIC CONTACT FOR GROUP III-V P-TYPE SEMICONDUCTORS

[75] Inventors: Neil E. Collins, Richmond Heights; Ira E. Halt, Chesterland, both of Ohio

[73] Assignee: General Electric Company, Schenectady, N.Y.

[22] Filed: Apr. 18, 1972

[21] Appl. No.: 245,283

Related U.S. Application Data

[62] Division of Ser. No. 101,971, Dec. 28, 1970, Pat. No. 3,684,930.

[52] U.S. Cl. .................................... 29/589, 148/1.5

[51] Int. Cl. ............................................ B01j 17/00

[58] Field of Search ........................ 29/589; 148/1.5; 317/234 M, 234 N

[56] References Cited

UNITED STATES PATENTS

| | | | |
|---|---|---|---|
| 3,525,146 | 8/1970 | Hayashida et al. | 317/234 M |
| 3,593,070 | 7/1971 | Reed | 317/234 |
| 3,636,617 | 1/1972 | Schmidt et al. | 29/589 |
| 3,660,734 | 5/1972 | Iida et al. | 317/235 |

*Primary Examiner*—Charles W. Lanham
*Assistant Examiner*—Wilbur C. Tupman
*Attorney*—Norman C. Fulmer et al.

[57] ABSTRACT

A combination of gold-germanium or gold-silicon alloy and zinc or other metallic Group II element provides an electrical contact and low-temperature bonding material for p-type semiconductors of Group III–V such as gallium arsenide.

3 Claims, 7 Drawing Figures

OHMIC CONTACT FOR GROUP III-V P-TYPE SEMICONDUCTORS

This is a division of application Ser. No. 101,971, filed Dec. 28, 1970, now U.S. Pat. No. 3,684,930.

BACKGROUND OF THE INVENTION

The invention is in the field of making ohmic contacts on semiconductor materials, and bonding the ohmic contact to a header. More particularly, the invention relates to ohmic contacts and bonding for Group III–V p-type semiconductors such as gallium arsenide.

Light-emitting diodes, i.e., solid-state lamps, are one type of device, among others, which make use of p-type semiconductor material. A light-emitting diode may comprise a p-n junction, which emits light when current is passed therethrough, formed at the junction of p-type and an n-type semiconductor material such as gallium arsenide. The p-type and n-type regions are formed by doping the basic material with certain impurities in a suitable process, such as diffusion or epitaxial growth. In manufacture, a thin wafer of the basic material, such as gallium arsenide, is processed to form a p-n junction between and parallel to the larger faces of the wafer, and the wafer is then severed into a plurality of pellets each containing a p-n junction. Each pellet is then assembled into a lamp housing, making suitable electrical connections to the p-side and n-side thereof so that current can be made to flow through the p-n junction for causing light to be emitted. One way of accomplishing this is to place the pellet, p-side down, on a gold-plated Kovar header, and heat to over 500° C to cause the pellet to fuse to the gold-plated header. A small "dot" contact is made to the n-side of the pellet, to complete the electrical connections; the header provides electrical connection to the p-side of the pellet. The aforesaid heating of the assembly to fuse the pellet to the header undesirably tends to reduce the light-emitting capability of the diode, and reduction of the temperature employed for the fusing tends to result in unsatisfactory bonding of the diode pellet to the header.

SUMMARY OF THE INVENTION

Objects of the invention are to provide an improved electrical contact and bonding material and method for p-type Group III–V semiconductors, and to make the electrical contact and bonding by the use of lower temperatures than heretofore.

The invention comprises, briefly and in a preferred embodiment, a contact and bonding material for p-type Group III–V semiconductors, such as gallium arsenide, comprising a combination of gold-germanium or gold-silicon alloy (preferably the eutectic) and a Group II metallic element such as zinc. Preferably, the Group II metallic element is zinc and is about 1 percent to 15 percent by weight of the gold-germanium eutectic alloy. A preferred method of manufacture comprises the steps of depositing a layer of gold-germanium eutectic alloy onto a p-type surface of a wafer of Group III–V semiconductor material, depositing a layer of a Group II metallic element over the eutectic alloy layer, heating to sinter the deposited layers into the p-type surface of the wafer, severing the wafer into pellets, placing a pellet p-side down on a gold-plated header, and heating momentarily to fuse the pellet to the header.

DESCRIPTION OF THE PREFERRED EMBODIMENT

Figure 1:
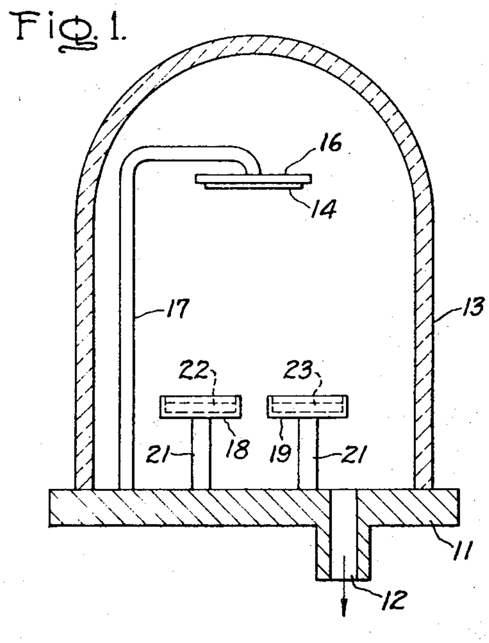
FIG. 1 is a cross-sectional view of a vacuum evaporation chamber, in which the electrical contact and bonding material of the invention is formed on a p-surface of a semiconductor wafer.

The vacuum evaporation apparatus of FIG. 1 consists of a base plate 11 provided with a vacuum port 12, and a cover 13, preferably of glass, which fits onto the base 11 in a vacuum tight manner. A wafer 14 having a p-type surface of Group III–V, such as gallium arsenide, gallium phosphide, or gallium arsenide phosphide, is supported, p-surface down, by means of being clamped or otherwise attached to a support plate 16 which is positioned within the vacuum chamber by means of a bracket 17 attached to the base 11. A pair of boats 18 and 19 are supported from the base 11 by means of posts 21 which provide electrical and thermal insulation of the boats 18, 19 from the base 11. Preferably the boats 18 and 19 are made of metal and are arranged to be heated by passing electrical current directly through the metal of the boats. One of the boats 18 carries gold-germanium or gold-silicon alloy 22, and the other boat 19 carries a Group II metallic element, such as zinc of high purity (such as 99.999 percent purity). Preferably the aforesaid alloy is a eutectic, although in the case of gold-germanium alloy the amount of germanium can be from about 5 percent to 25 percent by weight of the alloy, and in the case of gold-silicon alloy the amount of silicon can be from about 4 percent to 10 percent by weight of the alloy.

The apparatus is evacuated, and the boat 18 containing the gold-germanium alloy 22 is heated electrically or by other means, so as to cause a layer of the alloy to become deposited on the under surface of the wafer 14 on the p-side thereof, preferably to a thickness of about 8,000 to 20,000 Angstroms. The boat 19, containing the Group II metallic element such as zinc, then is heated so as to cause a layer of the Group II metallic element to become deposited against the alloy layer, this second layer preferably being about 200 to 2,000 Angstroms in thickness, or about 1 percent to 15 percent by weight of the first-deposited layer.

Figure 2:
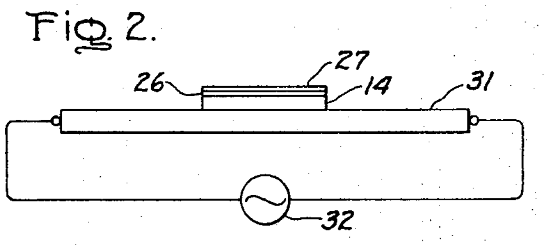
FIG. 2 is a side view showing the wafer, with evaporated materials thereon, being heated on an electrically heated strip heater.

The wafer 14, carrying the first layer 26 of the eutectic alloy and the second layer 27 of the Group II metallic element, is placed on a strip heater 31, as shown in FIG. 2, with the deposited layers 26 and 27 on upper side, and is heated by means of electrical current from a current source 32, in an inert or reducing atmosphere (such as hydrogen or nitrogen) to a temperature of about 450° C, momentarily, to sinter the layers 26 and 27 into the surface of the wafer 14.

Figure 3:
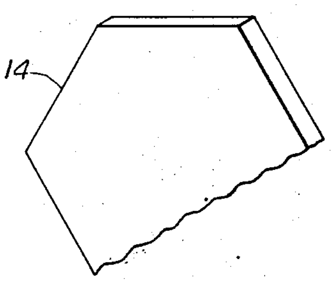
FIG. 3 is a perspective view of the wafer after the deposited materials have been fused into the p-surface thereof as illustrated in FIG. 2.
Figure 4:
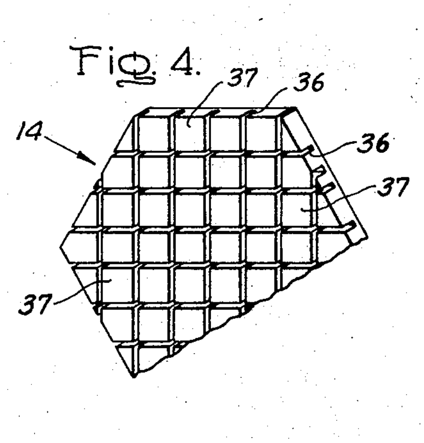
FIG. 4 is a perspective view of the wafer after the surface thereof has been scribed so that the wafer may be severed into a plurality of pellets.
Figures 5, 7:
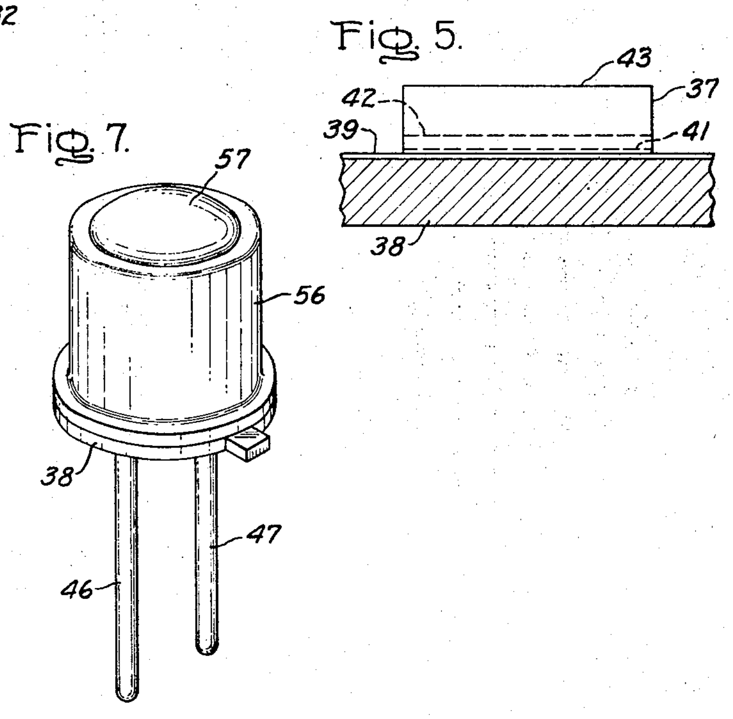
FIG. 5 is a side view of a pellet, placed p-side down on a header.
FIG. 7 is a perspective view of a solid-state lamp having a lens housing attached to the header assembly of FIG. 6.

At this stage, the wafer may look somewhat as shown in FIG. 3, and then is scribed in a criss-cross manner as indicated by the numerals 36 in FIG. 4 to define individual pellets 37, and then is severed to provide a plurality of individual pellets 37. A pellet 37 is positioned, p-side down, onto a gold-plated header, as shown in FIG. 5, in which the header 38, which may be of Kovar, is plated with a layer of gold 39. The dashed line 41 indicates the depth of penetration into the pellet 37 of the composition of gold-germanium eutectic alloy and Group II metallic element, as has been described above. Assuming that the wafer 37 contains a p-n junction, this junction would be located approximately as indicated by the dashed line 42, the upper portion 43 of the wafer 37 being of n-type material.

The header 38 and pellet 37, as shown in FIG. 5, are then heated by any convenient means, such as in a furnace or by placing the header 38 on a strip heater, in an inert or reducing atmosphere (such as hydrogen or nitrogen) to a temperature between 400° and 500° C, momentarily, to fuse the pellet 37 to the gold-plating 39 of the header 38, which is accomplished due to melting of the composition material which has been sintered into the p-surface of the pellet as described above.

Figure 6:
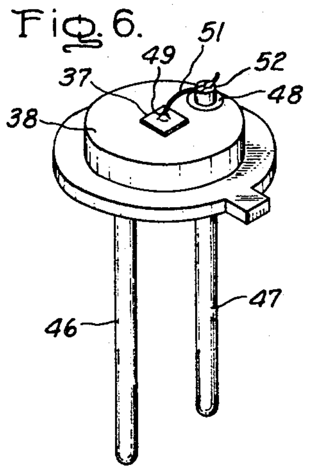
FIG. 6 is a perspective view of the pellet on a header.

FIG. 6 shows a typical header 38, with the pellet 37 bonded thereto as described above. A first lead wire 46 is attached to the header 38, and a second lead wire 47 extends through an opening in the header 38 and is attached to and insulated from the header by means of an insulating material 48 such as glass. A "dot" size contact 49 is provided on the upper or n-surface of the pellet 38, by well known means, and a connector wire 51 is electrically and mechanically attached to the dot contact 49 and the upper end 52 of the second connector wire 47. A protective housing 56 may be positioned over and attached to the header 38, as shown in FIG. 7, and may be provided with a lens 57 in an opening at the outer ends thereof, so that when the light-emitting diode wafer 37 emits light due to current being passed through the p-n junction 42 thereof by means of voltage applied to the lead wires 46 and 47, the emitted light will be focused by the lens 57 in a desired manner.

The electrical contact and bonding material composition of the invention, comprising a combination of gold-germanium or gold-silicon alloy and a Group II metallic element, as described above, permits bonding of the pellet 37 to the header 38 at a lower temperature, for example approximately 100° C lower, than the temperature heretofore required for bonding p-type material directly to the gold plating 39 of the header 38. At the same time, a bond of very high mechanical strength is achieved. Thus, good bonding is achieved at reduced temperature, thus reducing the likelihood of damaging the light-emitting capability of the p-n junction diode.

The method of the invention, by applying the electrical contact and bonding material to the p-surface of the pellets 37, permits temporary electrical connection to be made to the p-side, while another electrical contact is made to the "dot" contact 49 which has been previously applied to the n-side of the diode in well known manner, so that the light emission capability and other characteristics of the diode can be measured before the diode is bonded to a header, whereby defective diodes can be rejected before they are bonded to the relatively expensive header assembly.

The invention, in addition to achieving improved bonding at a lower temperature, also provides a highly desirable lower resistance of the connection between the p-surface and the header, resulting in increased efficiency, greater light output, and lower heating of the lamp during operation. The amounts of the gold-germanium alloy and the Group II metallic element, are not particularly critical, and good results have been obtained using the ranges of these materials as described above.

While preferred embodiments of the invention have been shown and described, various other embodiments and modifications thereof will become apparent to persons skilled in the art, and will fall within the scope of invention as defined in the following claims.

What we claim as new and desire to secure by Letters Patent of the United States is:

1. A method of making an ohmic contact and mechanical bond between a Group III–V p-type material and a metal header, comprising the steps of evaporating onto a surface of said p-type material a layer of gold-germanium or gold-silicon alloy to a thickness of about 8,000 to 20,000 Angstroms and a layer of a Group II metallic element to a thickness of about 200 to 2,000 Angstroms, heating to about 450° C in an inert or reducing atmosphere to sinter said layers into said surface of the p-type material, positioning siad p-type material with said surface against said header, and heating to about 400° to 500° C in an inert or reducing atmosphere to fuse said p-type material to said header.

2. A method as claimed in claim 1, in which said metal header is gold plated at the region of contact with said p-type material.

3. A method as claimed in claim 1, in which said Group II metallic element is zinc, and in which said Group III–V p-type material is gallium arsenide, gallium phosphide, or gallium arsenide phosphide.

* * * * *